United States Patent [19]

Hoelzel et al.

[11] Patent Number: 4,763,298

[45] Date of Patent: Aug. 9, 1988

[54] MEMORY ASSEMBLY WITH COOLING INSERT

[75] Inventors: Roy J. Hoelzel; Brent H. Doyle, both of Minneapolis, Minn.

[73] Assignee: ETA Systems, Inc., St. Paul, Minn.

[21] Appl. No.: 3,495

[22] Filed: Jan. 15, 1987

[51] Int. Cl.$^4$ .................. G11C 5/04; H05K 7/14; H05K 7/20

[52] U.S. Cl. .................. 365/51; 361/381

[58] Field of Search .................. 365/51; 361/380, 381, 361/413, 416

[56] References Cited

U.S. PATENT DOCUMENTS 4,682,208  7/1987  Ohashi et al. .................. 361/381 X
4,730,232  3/1988  Lindberg .................. 361/381

Primary Examiner—Stuart N. Hecker
Assistant Examiner—Alyssa Bowler
Attorney, Agent, or Firm—Kinney & Lange

[57] ABSTRACT

A digital memory structured of interconnection substrates, input and output substrates and memory substrates affixed to a cooling insert.

31 Claims, 2 Drawing Sheets

MEMORY ASSEMBLY WITH COOLING INSERT

BACKGROUND OF THE INVENTION

Field of the Invention

The present invention relates to assemblies of memory network substrates, and more particularly, to such assemblies supporting monolithic integrated circuits and the cooling thereof.

The criteria for digital memories continues to be the density of information storage, the rapidity possible in acquiring the information stored or in changing that information, and the cost of the digital memory. These criteria are used not only with respect to monolithic integrated circuit memory chips, which are the basis currently on which digital memories are made, but also to the assemblies of the substrates on which such integrated circuits are mounted. These substrates provide electrical interconnections between such chips and to whatever external electronic apparatus is making use of such digital memories. That is, the assemblies of these substrates must also be dense, operate rapidly and must achieve these goals economically.

Indeed, improvements in monolithic integrated circuits in achieving these goals with respect to them leads to greater demands on the digital memory substrates. Integrated circuits, in achieving greater density at higher speed, also tend to increase the power dissipation in each. This increasing heat must be removed from the digital memory, and doing so becomes an even greater burden as the heat density increases because of further compacting of the memory. Furthermore, increases in operating rapidity of the integrated circuits, and increases in the necessary interconnections made thereto because of increased circuit density therein, in turn lead to significant increases in the performance required of the interconnections in the digital memory substrates if the improvements in the integrated circuits are not to be lost. In general, this means that the circuit paths in the digital memory assembly are to be kept as short as possible, with the circuit impedances thereof carefully managed.

To achieve these goals, a desirable digital circuit memory substrate assembly would require no additional parts in its construction other than the basic integrated circuits, and the mounting substrates and interconnections which must be provided therefor, to thereby reduce the costs of assembly and to provide for a compact assembly. Further, such a digital circuit memory should accomodate a compact but effective cooling means to manage the heat dissipation in such a dense assembly.

SUMMARY OF THE INVENTION

The present invention provides a plurality of interconnection substrates, or circuit cards, with an input substrate and an output substrate, each having connectors for mating with external apparatus and having further connectors for mating with a signal transmission substrate on either side thereof. Memory module substrates or cards are also provided between these transmission substrates. Cooling chambers can be inserted in this assembly between the various substrates with the chambers having holes therein across from the integrated circuits to provide a stream of gas thereon for purposes of cooling.

DETAILED DESCRIPTION OF THE PREFERRED EMBODIMENTS

Figure 1:
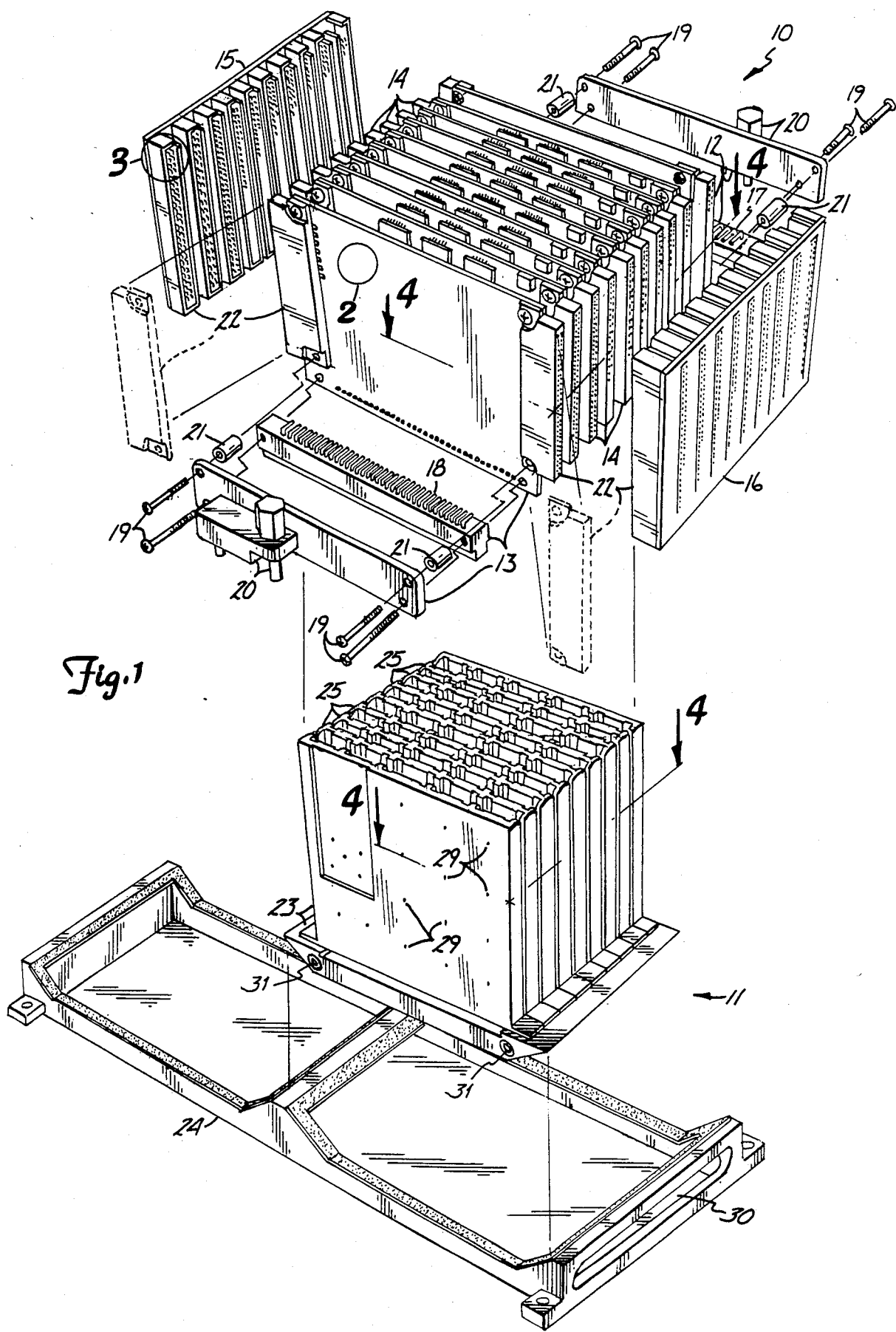
FIG. 1 shows an exploded view of the present invention.

FIG. 1 shows an exploded view of a digital circuit memory substrate assembly, 10, with a multiple chamber cooling insert, 11. The digital memory is, in common engineering terms, a 512K word memory by 39 bits (actually a 524,288 word memory) capable of having information placed therein and information acquired therefrom in times ranging from 5 to 20 nanoseconds at typical operating voltages of around 5 volts.

Substrate assembly 10 is approximately four inches wide by just over three and one-half inches deep, and just over four inches high. Within this small volume, cooling must be provided because assembly 10 may draw from 12 to 18 amps at the above-described information transfer rates. Such cooling is provided by using insert 11 to distribute chilled air, typically 0° C., provided under pressure.

Substrate assembly 10 comprises one input interconnection network substrate and associated connectors, 12, (or input board or card), one output interconnection network substrate and associated connectors, 13, (or output board or card), and eight memory module interconnection network substrates, 14, (or memory boards or cards), all parallel to one another in FIG. 1. In addition, each of the foregoing substrates, on its left hand side in FIG. 1, is connected into a first transmission interconnection network substrate, 15 (or write or input board or card). This same set of parallel substrates, each on the right hand side thereof, is connected into a second transmission interconnection network substrate, 16 (or read or output card or board).

External signals from that external apparatus using the digital memory of FIG. 1 are provided to the memory via a 96 pin connector, 17, which is affixed to and is part of input board 12. Signals provided by the digital memory to such apparatus, on the other hand, are made available at another 96 pin connector, 18, affixed to and part of output board 13. These connectors are so affixed by threaded fasteners, 19, which also affix a pair of digital memory assembly fasteners, 20, to the input and output boards. Note that there is an indexing pin in fastening systems 20 with a different spacing for input board 12 than for output board 13 so that assembly 10 cannot be interchanged end-for-end. Some of fasteners 19 go through spacers, 21, to provide fastening means 20 with a standoff over the corresponding 96 pin connectors 17 and 18.

The input signals entering the digital memory assembly 10 through connector 17 involve 39 data lines, 18 address lines and various operation control lines. The signal interconnections leading from connector 17 to remaining parts of input board 12 all have the transmission line impedance thereof carefully chosen to meet transmission needs insofar as effects on signals transmitted thereover is concerned. Certain tuning jumpers are used thereon to accurately adjust delays in the clock signal paths to provide accurate timing signals in the digital memory.

Input board 12 is a multiple tier interconnection board, that is, board 12 has multiple metallic interconnection levels each separated from each adjacent one by a dielectric material layer except at feedthroughs. Such metallic feedthroughs interconnect the intereconnection levels by passing through dielectrics. Input board 12 has eight levels of interconnections separated by seven dielectric layers.

The system input signals coming from connector 17 are routed to various monolithic integrated circuits, serving variously as resistors, buffers and decision logic modules, on input board 12. These integrated circuits are complementary silicon gate, metal-oxide-semiconductor (MOS) field-effect transistor (FET) based circuits. Signals generated in these integrated circuits then leave input board 12 for other destinations in the digital memory. The data and address lines leave the registers in the integrated circuits on input board 12 through an internal electrical connector, 22, having its first member affixed to input board 12 by threaded fasteners clamping this first member against surface interconnections. A corresponding second member, which together with the first member form an internal connector 22, is affixed to write board 15. This internal connector is a 101 pin connector. Certain of the control signals are also carried through this connector. Another connector 22 of the same general type is provided at the opposite edge of input board 12, this internal connector having its first member affixed to input board 12 and its second member affixed to read board 16. Certain control signals also leave input board 12 through this second internal connector for read board 16.

Write board 15 contains the memory write data bus and address bus interconnections which are connected to all eight of memory boards 14. These control signals from input board 12 which are provided to write board 15 are carried also by write board 15 to selected ones of memory boards 14.

Write board 15 has ten levels of metallic interconnections separated by nine dielectric material layers. The transmission line impedances of these are again carefully arranged to avoid or minimize unwanted signal effects. Metallic feedthroughs between various levels of these interconnections interconnect them. Connector 22 second members, one for every memory board 14 and for input board 12 and output board 13, are affixed to write board 15 and clamped against a surface level of interconnections.

Read board 16 has on it the memory read data bus interconnections which are all connected to all of memory boards 14. Certain control signals are also carried by the interconnections on read board 16 to selected memory boards 14, as are certain clock signals. A clock signal is also transmitted by read board 16 to output board 13.

Read board 16 has eight levels of metallic interconnections separated by seven dielectric material layers. Metallic feedthroughs are provided here also between various interconnection levels. Once again, associated transmission line impedances are all carefully chosen to avoid or minimize unwanted signal effects. Connector 22 second members, again one for every memory board 14 and for input board 12 and output board 13, are clamped against a surface level of interconnections on read board 16.

Each memory board 14 has six levels of metallic interconnections separated by five dielectric material layers. Again, there are metallic feedthroughs, conductors extending through the dielectrics, to interconnect the various interconnection levels. Each of memory boards 14 also has an internal connector 22 first member on each side thereof. Each of these connectors fits into a corresponding mating second connector, one on each of write board 15 and read board 16.

Each memory board 14 has CMOS integrated circuits on it forming static random access memory chips providing together storage in common engineering terms of 64K words (actually 65,536 words) of 39 bits each. All of the data and address inputs to each memory card 14 is clocked into integrated circuits serving as registers to receive such inputs. Data leaving memory boards 14 is also first stored in buffer registers from which it can be switched into the read data bus. Various control and clock signals transmitted from write board 15 and read board 16 control these operations in memory board 14.

Output board 13 receives the read data line bus and stores data on it in registers formed in CMOS integrated circuits thereon. Output board 13 has eight levels of metallic interconnections separated by seven dielectric material layers with appropriate metallic feedthroughs to interconnect with various interconnection levels. Again, the impedance of the various interconnection lines is carefully managed as are the delays in the clock signal interconnection lines. Connector 22 first members are clamped at either side against a surface interconnection level for mating with corresponding second members on write board 15 and read board 16.

Figure 2:
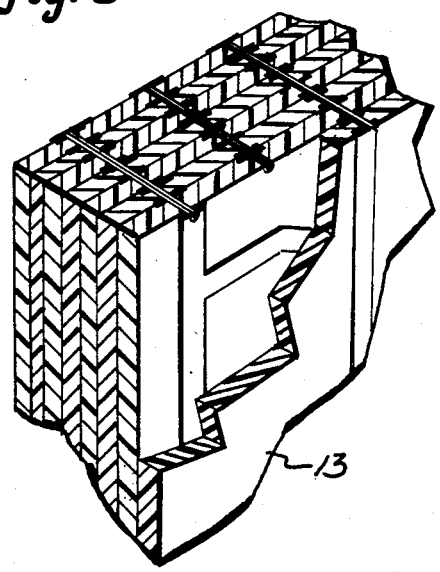
FIG. 2 shows a breakaway view of a portion of FIG. 1.

FIG. 2 shows a breakout of output board 13, as indicated in FIG. 1. There can be seen the dielectric layers separating the metal interconnection levels and a feedthrough between the surface interconnection layer and the first interconnection layer therebelow. These various dielectric layers and interconnection layers all adhere to one another in the order shown in FIG. 2 to thereby provide a single output board, multiple interconnection level structure. The structures for input board 12, memory boards 14, write board 15 and read board 16 are similar, even though there may be differences in numbers of interconnection levels and dielectric layers.

Figure 3:
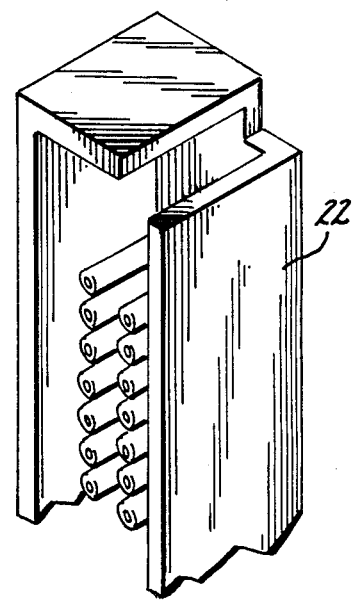
FIG. 3 shows a breakaway view of a portion of FIG. 1.

Internal connectors 22 are formed with the second members being female portions thereof and mounted on write board 15 and read board 16. Internal connector 22 first members are then, of course, male portions of the internal connectors and mount on the input board 12, output board 13 and memory boards 14, as above indicated. A breakout of a portion of a second member of an internal connector 22 mounted on write board 15 is shown in FIG. 3, as indicated in FIG. 1. There can be seen the sockets of the connector 22 female second member which are closely fitted with the corresponding pins in the male first member.

These pins have significant lengths and, inserted into the corresponding sockets just described, lend substantial rigidity to the mechanical connections made by connectors 22. As a result, digital circuit memory substrate assembly 10 is held together with nothing more than these matings of internal connector 22 first members with second members. That is, for purposes of handling, of testing, and of insertion of the assembly into higher assemblies in the external apparatus using digital memory 10, no other supports are provided for holding the various boards described together as a single unit. Therefore, there is no space taken by extra mechanical support frameworks or fasteners to thereby improve compactness of the assembly, and there is no extra cost in assembling such extras. Once the boards with the connector members affixed thereto are assembled to the mating portions of the internal connectors 22, no further assembly effort is required.

The substantial memory capacity provided in digital memory 10 in the small volume described above leads to a substantial amount of heat being generated in this relatively small volume. Thus, cooling insert arrangement 11 is used to distribute chilled air into the spaces between memory boards 14, and the spaces between memory boards 14 and input and output boards 12 and 13, to there impinge directly upon the monolithic integrated circuits as affixed to each of these boards.

Cooling insert arrangement 11 comprises an insert portion, 23, and a base interface portion, 24. Insert portion 23 comprises a series of enclosed chamber structures, 25. Each of these chamber structures is further subdivided into enclosed chambers by a number of vertical stiffening supports between each enclosed chamber. In addition, the stiffening supports have linear protrusions therealong projecting outward from surfaces of enclosed chamber structures 25. Insert portion 23 with enclosed chamber structures 25 is, in use, inserted in the spaces between memory boards 14 and between memory boards 14 and input board 12 and output board 13.

The integrated circuits affixed to these boards are provided in vertical columns on these boards to thereby fit between pairs of linear protuberances. Each enclosed chamber has a hole therein directly across from each of those monolithic integrated circuits in the corresponding column thereof so that chilled air brought to the common chamber beneath insert portion 23 can travel through the various enclosed chambers and out the holes to impinge directly on such monolithic integrated circuits.

Figure 4:
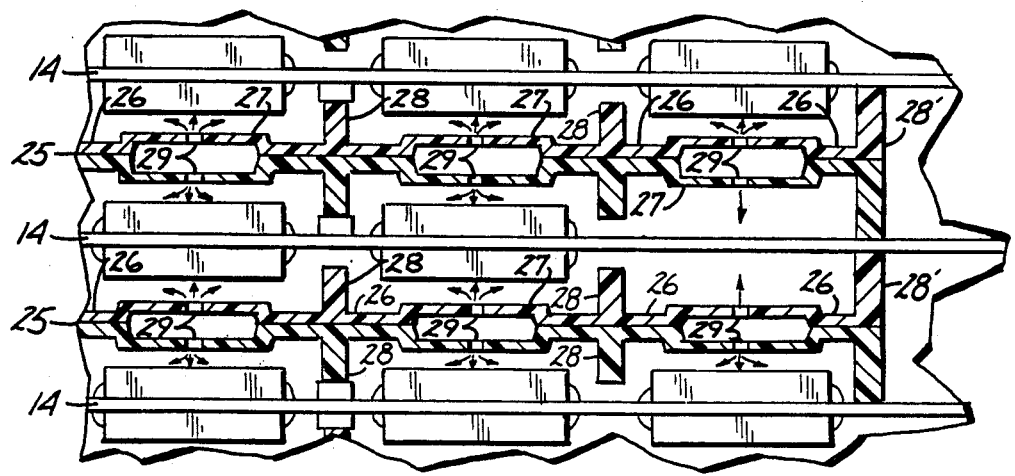
FIG. 4 shows a breakaway view of a cross section of FIG. 1.

A broken out portion of cross section view 4—4 of FIG. 1 forms FIG. 4 and better shows this relationship between insert portion 23 and assembly 10. As can be seen, memory boards 14 having integrated circuits positioned on either side thereof are shown as examples with gas chamber structures 25 provided in the spaces between boards 14 and between the integrated circuits also in that space between boards 14. There can be further seen support structures, 26, separating individual gas chamber enclosures, 27. Linear protrusions, 28, extend outward from the surface of supports 26. In some instances, protrusions 28 are directly against components on memory boards 14 and, in any event, assure that there will be adequate separation between these boards at all times. End linear protrusions, 28', give additional such assurance in actually being against memory boards 14 and input and output boards 12 and 13. As can be further seen, holes, 29, in gas chamber enclosures 27 permit air under pressure to impinge directly on the monolithic integrated circuits across from such holes.

Insert portion 23, with digital memory 10 affixed thereto, fits against base interface 24, as can be seen in FIG. 1. Base interface 24 provides additional volume for a common chamber beneath insert portion 23. Chilled air is forced into this chamber through an opening, 30, in base interface 24. Base interface 24 could accommodate a second combination of a memory 10 and an insert portion 23, as can be seen in FIG. 1. If yet another pair of memory assemblies is desired, these could be placed over inserts in an adjacent base interface to the right of the one shown in FIG. 1. That adjacent base interface, however, would have a hole like hole 30 at both ends thereof to permit air under pressure to not only reach this adjacent base interface but also base interface 24.

Insert 23 has memory 10 affixed to it by the lower ones of threaded fastners 19 in FIG. 1, each being screwed onto threaded insert, 31, in cooling insert 23. Connectors 17 and 18 fit over the sides of base interface 24 to mate with connectors positioned along the sides in that apparatus making use of the digital memory. Connectors 20 can be used to fasten assembly 10 and insert 11 to such apparatus.

Clearly, the number of memory boards provided in assembly 10 is subject to being increased or decreased from the eight shown in FIG. 1. In this regard, although the present invention has been described with reference to preferred embodiments, workers skilled in the art will recognize that changes may be made in form and detail without departing from the spirit and scope of the invention.

What is claimed is:

1. A memory system assembly, said assembly comprising:

an input interconnection network substrate having a system input electrical connector pair first member affixed at a first edge portion thereof which can be selectively mated with a system input electrical connector pair second member connected to external electrical apparatus to pass electrical signals therebetween, said input substrate first edge portion being located between input substrate second and third edge portions with said input substrate second edge portion having a first internal electrical connector pair first member affixed thereto and with said input substrate third edge portion having a second internal electrical connector pair first member affixed thereto, there being electrical interconnections provided between each of said first and second internal electrical connector pair first members and said system input electrical connector pair first member;

an output interconnection network substrate having a system output electrical connector pair first member affixed at a first edge portion thereof which can be selectively mated with a system output electrical connector pair second member connected to external electrical apparatus to pass electrical signals therebetween, said output substrate first edge portion being located between output substrate second and third edge portions with said output substrate second edge portion having a third internal electrical connector pair first member affixed thereto and with said output substrate third edge portion having a fourth internal connector pair first member affixed thereto, there being electrical interconnections provided between each said third and fourth internal electrical connector pair first members and said system output electrical connector first member;

a first transmission interconnection network substrate having selected internal electrical connector pair second members affixed thereto including first and third internal electrical connection pair second members capable of being mechanically and electrically connected with said first and third internal electrical pair first members, respectively, there being electrical interconnections selectively provided between said plurality of internal electrical connector pair second members, said first and third internal electrical connector pair first members being mechanically and electrically connected with said first and third internal electrical connector pair second members, respectively;

a second transmission interconnection network substrate having selected internal electrical connector pair second members affixed thereto including second and fourth internal electrical connector pair second members capable of being mechanically and electrically connected with said second and fourth internal electrical pair first members, respectively, there being electrical interconnections selectively provided between said plurality of internal electrical connector pair second members, said second and fourth internal electrical connector pair first members being mechanically and electrically connected with said second and fourth internal electrical connector pair second members, respectively; and a plurality of memory module interconnection network substrates each having a pair of internal electrical connector pair first members affixed at selected edges thereof one of which is capable of being, and is, mechanically and electrically connected with at least one of said selected internal electrical connector pair second members affixed to said first transmission interconnection network substrate, as aforesaid, and that one remaining capable of being, and is, mechanically and electrically connected with at least one of said selected internal electrical connector pair second members affixed to said second transmission interconnection network substrate, as aforesaid, each of said plurality of memory module interconnection network substrates having at least one electronic memory circuit means affixed thereto with each said electronic memory circuit means having an electrical interconnection to each of said internal electrical connector pair first members affixed thereto, as aforesaid, said connections of said internal electrical connector pair first and second members being solely relied upon to mechanically connect, in that manner aforesaid, said input, output, first transmission, second transmission and plurality of memory module interconnection network substrates.

2. The apparatus of claim 1 wherein said electronic memory circuit means is a monolithic integrated circuit.

3. The apparatus of claim 1 wherein each of said input and output interconnection network substrates and each of said plurality of memory module interconnection network substrates has a monolithic integrated circuit affixed thereto.

4. The apparatus of claim 1 wherein each of said input and output interconnection network substrates, said plurality of memory module interconnection network substrates, and said first and second transmission interconnection network substrates are formed with a plurality of dielectric layers separating a plurality of interconnection network portions.

5. The apparatus of claim 1 wherein at least some of those spaces occuring between members of said plurality of memory module interconnection network substrates and between members of said plurality of memory module interconnection network substrates and said input and output interconnection network substrates have substantially enclosed gas chambers located therein with openings in said gas chambers opposite said electronic memory circuit means so that if a pressurized gas is supplied to said gas chambers that gas escaping from said openings therein will impinge on said electronic memory circuit means.

6. The apparatus of claim 1 wherein each of said plurality of memory module interconnection network substrates is positioned between said input and output interconnection network substrates.

7. The apparatus of claim 1 wherein at least one interconnection in said first transmission interconnection network substrate is made commonly to each of said selected internal electrical connector pair second members affixed thereto.

8. The appartus of claim 1 wherein at least one interconnection in said second transmission interconnection network substrate is made commonly to each of said selected internal electrical connector pair second members affixed thereto.

9. The apparatus of claim 1 wherein said internal electrical connector pair first members are substantially identical to one another, and said internal electrical connector pair second members are substantially identical to one another.

10. The apparatus of claim 3 wherein each of said monolithic integrated circuits is positioned in those spaces occuring between any pair of said memory module interconnection network substrates and said input and output interconnection substrates.

11. The apparatus of claim 5 wherein each of said gas enclosure chambers opens into a common supply chamber adapted for connection to a source of pressurized gas.

12. The appartus of claim 7 wherein at least one interconnection in said second transmission interconnection network substrate is made commonly to each of said selected internal electrical connector pair second members affixed thereto.

13. The apparatus of claim 10 wherein at least some of those spaces occuring between members of said plurality of memory module interconnection network substrates and between members of said plurality of memory module interconnection network substrates and said input and output interconnection network substrates have substantially enclosed gas chambers located therein with openings in said gas chambers opposite said electronic memory circuit means so that if a pressurized gas is supplied to said gas chambers that gas escaping from said openings therein will impinge on said electronic memory circuit means.

14. The apparatus of claim 11 wherein at least one of said plurality of memory module interconnection substrates has a plurality of electronic memory circuit means affixed thereto in a column so that a said gas chamber on a said space adjacent such a memory module interconnection substrate, having a pair of linear protrusions from its surface, has one of said linear protrusions on either side of said column.

15. The apparatus of claim 12 wherein said internal electrical connector pair first members are substantially identical to one another, and said internal electrical connector pair second members are substantially identical to one another.

16. The apparatus of claim 13 wherein each of said plurality of memory module interconnection network substrates is positioned between said input and output interconnection network substrates.

17. The apparatus of claim 15 wherein each of said plurality of memory module interconnection network substrates is positioned between said input and output interconnection network substrates.

18. A memory system assembly, said assembly comprising:

an input interconnection network substrate having a system input electrical connector pair first member affixed at a first edge portion thereof which can be selectively mated with a system input electrical connector pair second member connected to external electrical apparatus to pass electrical signals therebetween, said input substrate first edge portion being located between input substrate second and third edge portions with said input substrate second edge portion having a first internal electrical connector pair first member affixed thereto and with said input substrate third edge portion having a second internal electrical connector pair first member affixed thereto, there being electrical interconnections provided between each of said first and second internal electrical connector pair first members and said system input electrical connector pair first member;

an output interconnection network substrate having a system output electrical connector pair first member affixed at a first edge portion thereof which can be selectively mated with a system output electrical connector pair second member connected to external electrical apparatus to pass electrical signals therebetween, said output substrate first edge portion being located between output substrate second and third edge portions with said output substrate second edge portion having a third internal electrical connector pair first member affixed thereto and with said output substrate third edge portion having a fourth internal connector pair first member affixed thereto, there being electrical interconnections provided between each said third and fourth internal electrical connector pair first members and said system output electrical connector first member;

a first transmission interconnection network substrate having selected internal electrical connector pair second members affixed thereto including first and third internal electrical connection pair second members capable of being mechanically and electrically connected with said first and third internal electrical pair first members, respectively, there being electrical interconnections selectively provided between said plurality of internal electrical connector pair second members, said first and third internal electrical connector pair first members being mechanically and electrically connected with said first and third internal electrical connector pair second members, respectively;

a second transmission interconnection network substrate having selected internal electrical connector pair second members affixed thereto including second and fourth internal electrical connector pair second members capable of being mechanically and electrically connected with said second and fourth internal electrical pair first members, respectively, there being electrical interconnections selectively provided between said plurality of internal electrical connector pair second members, said second and fourth internal electrical connector pair first members being mechanically and electrically connected with said second and fourth internal electrical connector pair second members, respectively; and a plurality of memory module interconnection network substrates each having a pair of internal electrical connector pair first members affixed at selected edges thereof one of which is capable of being, and is, mechanically and electrically connected with at least one of said selected internal electrical connector pair second members affixed to said first transmission interconnection network substrate, as aforesaid, and that one remaining capable of being, and is, mechanically and electrically connected with at least one of said selected internal electrical connector pair second members affixed to said second transmission interconnection network substrate, as aforesaid, each of said plurality of memory module interconnection network substrates having at least one electronic memory circuit means affixed thereto with each said electronic memory circuit means having an electrical interconnection to each of said internal electrical connector pair first members affixed thereto, as aforesaid; and a cooling insert means positioned in at least some of those spaces occuring between members of said plurality of memory module interconnection network substrates and said input and output interconnection network substrates, and having substantially enclosed gas chambers located therein with openings in said gas chambers opposite said electronic memory circuit means so that if a pressurized gas is supplied to said gas chambers that gas escaping from said openings therein will impinge on said electronic memory circuit means.

19. The apparatus of claim 18 wherein said electronic memory circuit means is a monolithic integrated circuit.

20. The apparatus of claim 18 wherein each of said input and output interconnection network substrates and each of said plurality of memory module interconnection network substrates has a monolithic integrated circuit affixed thereto.

21. The apparatus of claim 18 wherein each of said input and output interconnection network substrates, said plurality of memory module interconnection network substrates, and said first and second transmission interconnection network substrates are formed with a plurality of dielectric layers separating a plurality of interconnection network portions.

22. The apparatus of claim 18 wherein each of said plurality of memory module interconnection network substrates is positioned between said input and output interconnection network substrates.

23. The apparatus of claim 18 wherein at least one interconnection in said first transmission interconnection network substrate is made commonly to each of said selected internal electrical connector pair second members affixed thereto.

24. The appartus of claim 18 wherein at least one interconnection in said second transmission interconnection network substrate is made commonly to each of said selected internal electrical connector pair second members affixed thereto.

25. The apparatus of claim 18 wherein said internal electrical connector pair first members are substantially identical to one another, and said internal electrical connector pair second members are substantially identical to one another.

26. The apparatus of claim 18 wherein each of said gas enclosure chambers opens into a common supply chamber adapted for connection to a source of pressurized gas.

27. The apparatus of claim 20 wherein each of said monolithic integrated circuits is positioned in those spaces occuring between any pair of said memory module interconnection network substrates and said input and output interconnection substrates with said gas chambers located therein as aforesaid.

28. The apparatus of claim 23 wherein at least one interconnection in said second transmission interconnection network substrate is made commonly to each of said selected internal electrical connector pair second members affixed thereto.

29. The apparatus of claim 26 wherein at least one of said plurality of memory module interconnection substrates has a plurality of electronic memory circuit means affixed thereto in a column so that a said gas chamber on a said space adjacent such a memory module interconnection substrate, having a pair of linear protrusions from its surface, has one of said linear protrusions on either side of said column.

30. The apparatus of claim 28 wherein said internal electrical connector pair first members are substantially identical to one another, and said internal electrical connector pair second members are substantially identical to one another.

31. The apparatus of claim 30 wherein each of said plurality of memory module interconnection network substrates is positioned between said input and output interconnection network substrates.

* * * * *